(12) United States Patent
Lee et al.

(10) Patent No.: US 7,885,135 B2
(45) Date of Patent: Feb. 8, 2011

(54) SEMICONDUCTOR MEMORY DEVICE

(75) Inventors: Kang-Seol Lee, Gyeonggi-do (KR);
Seok-Cheol Yoon, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 121 days.

(21) Appl. No.: 12/323,221

(22) Filed: Nov. 25, 2008

(65) Prior Publication Data

US 2009/0323451 A1 Dec. 31, 2009

(30) Foreign Application Priority Data

Jun. 30, 2008 (KR) ...................... 10-2008-0063152

(51) Int. Cl.
*G11C 5/14* (2006.01)
(52) U.S. Cl. ....................... 365/226; 365/193
(58) Field of Classification Search ................. 365/226, 365/193
See application file for complete search history.

(56) References Cited

U.S. PATENT DOCUMENTS

| | | | |
|---|---|---|---|
| 5,650,975 A * | 7/1997 | Hamade et al. | 365/230.01 |
| 6,480,989 B2 | 11/2002 | Chan et al. | |
| 6,707,738 B2 * | 3/2004 | Choi et al. | 365/203 |
| 7,336,089 B2 | 2/2008 | Yang et al. | |
| 2006/0123376 A1 | 6/2006 | Vogel et al. | |

FOREIGN PATENT DOCUMENTS

| | | |
|---|---|---|
| KR | 1020040066306 A | 7/2004 |
| KR | 1020040107244 A | 12/2004 |

OTHER PUBLICATIONS

Notice of Preliminary Rejection issued from Korean Intellectual Property Office on Jul. 28, 2009 with an English Translation.

* cited by examiner

*Primary Examiner*—Son Dinh
*Assistant Examiner*—Nam Nguyen
(74) *Attorney, Agent, or Firm*—IP & T Group LLP

(57) ABSTRACT

A semiconductor memory device that prevents a power noise generated at a data input/output pad in a read operation from affecting a data strobe signal pad. The semiconductor memory device includes first power supply voltage pads for a data output circuit, a first power mesh, and a second power supply voltage pad for a data strobe signal output circuit. The first power mesh connects first power supply voltage pads to one another. The second power supply voltage pad is electrically separated from the first power mesh.

14 Claims, 3 Drawing Sheets

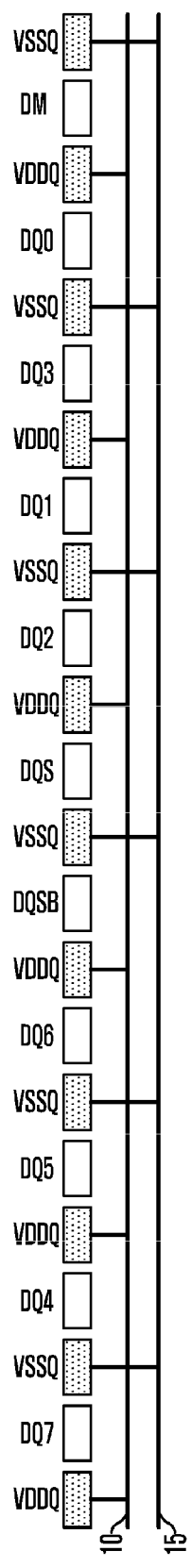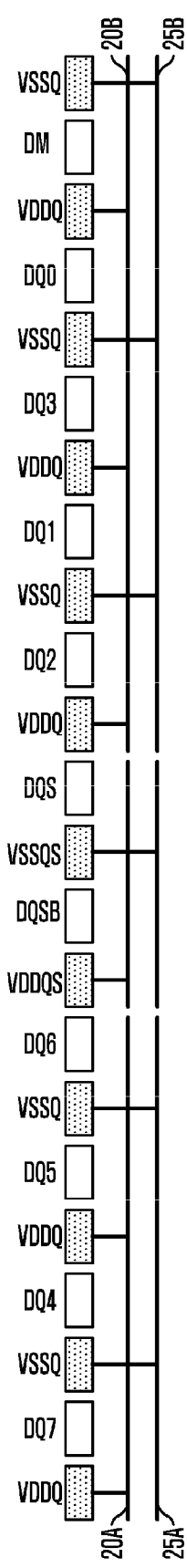
FIG. 1 (RELATED ART)
FIG. 2

SEMICONDUCTOR MEMORY DEVICE

CROSS-REFERENCE TO RELATED APPLICATION

The present invention claims priority of Korean patent application number 10-2008-0063152, filed on Jun. 30, 2008, which is incorporated by reference in its entirety.

BACKGROUND OF THE INVENTION

The present invention relates to a semiconductor design technology, and more particularly to power mesh routing of a semiconductor memory device.

Semiconductor memory devices such as a DRAM receive data from a chipset (memory controller) for a write operation and output data to the chipset for a read operation. For synchronous semiconductor memory devices, both the chipset and the memories are synchronized with system clocks. However, while transferring the data and the system clocks from the chipset to the memories, a skew is generated between the data and the system clocks, because of the differences of loadings and traces between the data and the system clocks and the difference in locations of the memories.

To reduce the skew between the data and the system clock, the chipset transfers data to the memory together with a data strobe signal (DQS). The data strobe signal (DQS) is referred to as an echo clock, and has the same loading and trace as the data. Accordingly, by strobing the data using the data strobe signal at the memory, it is possible to minimize the skew caused by the reason described above. Meanwhile, during the read period, the memory transfers to the chipset the data together with a read data strobe signal.

FIG. 1 is a diagram illustrating a pad layout and a power mesh routing of a conventional synchronous semiconductor memory device. Referring to FIG. 1, the conventional synchronous semiconductor memory device includes a plurality of data input/output pads DQ0 to DQ7, data strobe signal pads DQS and DQSB, and a data mask pad DM, and a plurality of power pads VDDQ and VSSQ for a driver.

The data input/output pads DQ0 to DQ7 are disposed to either side of the data strobe signal pads DQS and DQSB. The power pads VDDQ and VSSQ for the driver are disposed at spaces between the data input/output pads DQ0 to DQ7 and the data strobe signal pads DQS and DQSB. For reference, the data strobe signal DQSB is a differential signal of the data strobe signal DQS.

The power pads VDDQ for a supply voltage and the power pads VSSQ for a ground voltage are connected to one another through respective power meshes 10 and 15. This is aimed to reduce the resistance to thereby smoothly adjust the chip power supply state to all the circuits.

However, such a structure for routing the power mesh causes a simultaneous switching output (SSO) noise and deterioration of AC characteristics such as tDQSQ and tDQSCK. The semiconductor memory device is under restraint in a high speed read operation. Here, the tDQSQ is a parameter representing a skew of the data strobe signal DQS and the data DQ, and the tDQSCK is a parameter representing a skew of the data strobe signal DQS and the clock CLK.

These are not only related to a data pattern, but also related to the fact that a power noise, which is generated at the data input/output pads DQ due to the ringing back effect and the like, affects the data strobe signal pads DQS and DQSB.

SUMMARY OF THE INVENTION

Embodiments of the present invention are directed to providing a semiconductor memory device that prevents a power noise generated at a data input/output pad in a read operation from affecting a data strobe signal pad.

In accordance with an aspect of the invention, there is provided a semiconductor memory device, which includes a plurality of first power supply voltage pads for a data output circuit, a first power mesh configured to connect the first power voltage pads to one another, and a second power supply voltage pad for a data strobe signal output circuit, which is electrically separated from the first power mesh.

In accordance with an aspect of the invention, there is provided a synchronous semiconductor memory device, which includes a plurality of data input/output pads, a plurality of first power supply voltage pads for a data output circuit, a first power mesh configured to connect the first power supply voltage pads to one another, a data strobe signal input/output pad, a second power supply voltage pad for a data strobe signal output circuit, a second power mesh connected to the second power supply pad, and a first switch configured selectively to connect the first and second power meshes in response to a read period signal.

According to the embodiments, power for the data output circuit and power for the data strobe signal output circuit are separated from each other to prevent a power noise generated at the data input/output pad from affecting the data strobe signal pad. It is preferable in view of chip power supply efficiency that the powers are separated only during the read period. Accordingly, the separation of the powers is selectively performed using a switching circuit.

BRIEF DESCRIPTION OF THE DRAWINGS

FIG. 1 is a diagram illustrating a pad layout and a power mesh routing of a conventional synchronous semiconductor memory device.

FIG. 2 is a diagram illustrating a pad layout and a power mesh routing of a synchronous semiconductor memory device in accordance with an embodiment of the present invention.

DESCRIPTION OF SPECIFIC EMBODIMENTS

Hereinafter, a semiconductor memory device in accordance with the present invention will be described in detail with reference to the accompanying drawings.

FIG. 2 is a diagram illustrating a pad layout and a power mesh routing of a synchronous semiconductor memory device in accordance with an embodiment of the invention. Referring to FIG. 2, the synchronous semiconductor memory device includes a plurality of data input/output pads DQ0 to DQ7, data strobe signal pads DQS and DQSB, a plurality of power pads VDDQ and VSSQ for a data output driver, and a plurality of power pads VDDQS and VSSQS for a data strobe signal output driver. Here, 'DM' represents data mask pads.

The data input/output pads DQ0 to DQ7 are disposed to either side of the data strobe signal pads DQS and DQSB. The power pads VDDQ and VSSQ for the data output driver are disposed at spaces between the data input/output pads DQ0 to DQ7. The power pads VDDQS and VSSQS for the data strobe signal output driver are disposed adjacent to the data strobe signal pads DQS and DQSB respectively.

Power meshes 20A and 20B connected to the power supply voltage pads VDDQ for the data output driver are routed independently so that they are electrically separated from the power supply voltage pad VDDQS for the data strobe signal output driver. Power meshes 25A and 25B connected to the ground voltage pads VSSQ for the data output driver are routed independently so that they are electrically separated from the ground voltage pad VSSQS for the data strobe signal output driver.

For reference, the power pads VDDQS and VSSQS for the data strobe signal output driver are essentially the same as the power pads VDDQ and VSSQ for the data output driver, but have different reference numbers to stress the difference according to the separation of the power meshes.

Figure 3:
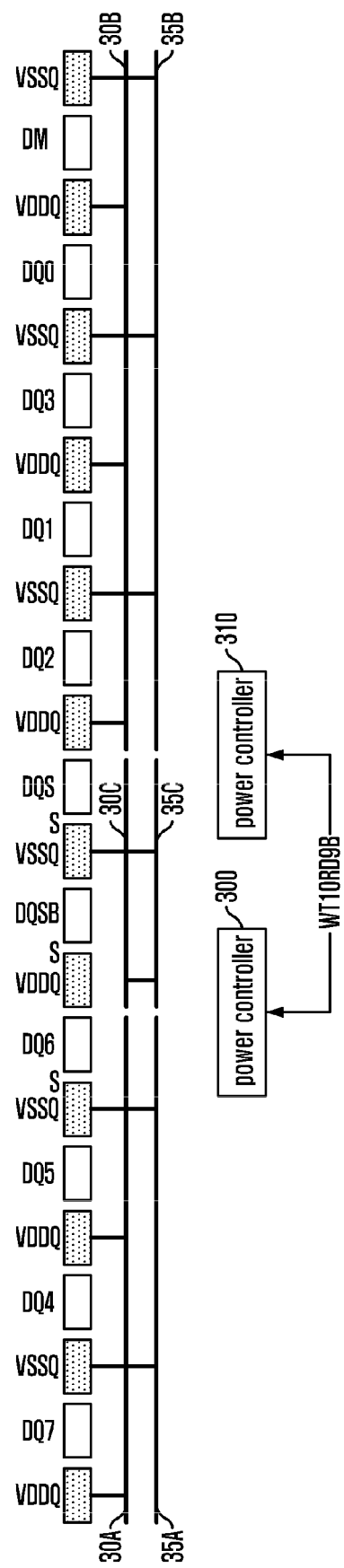
FIG. 3 is a diagram illustrating a pad layout and a power mesh routing of a synchronous semiconductor memory device in accordance with another embodiment of the invention.

FIG. 3 is a diagram illustrating a pad layout and a power mesh routing of a synchronous semiconductor memory device in accordance with another embodiment of the invention. Referring to FIG. 3, the synchronous semiconductor memory device of the present embodiment has basically the same pad layout and power mesh routing as that of the above described embodiment. That is, the synchronous semiconductor memory device is routed such that power meshes 30A, 30B, 35A and 35B corresponding to power pads VDDQ and VSSQ for a data output driver are separated from power meshes 30C and 35C corresponding to power pads VDDQS and VSSQS for a data strobe signal output driver.

However, the synchronous semiconductor memory device of the present embodiment is different from that of the above described embodiment in that power controllers 300 and 310 controlled by a read period signal WT10RD9B are provided between the power meshes 30C and 35C corresponding to the power pads VDDQS and VSSQS for the data strobe signal output driver and the power meshes 30A, 30B, 35A and 35B corresponding to the power pads VDDQ and VSSQ for the data output driver. The power controllers 300 and 310 are switching circuits configured to selectively connect the power meshes in response to the read period signal WT10RD9B. The power controller 300 is disposed between the power meshes 30C and 35C and the power meshes 30A and 35A, and the power controller 310 is disposed between the power meshes 30C and 35C and the power meshes 30B and 35B.

Figure 4:
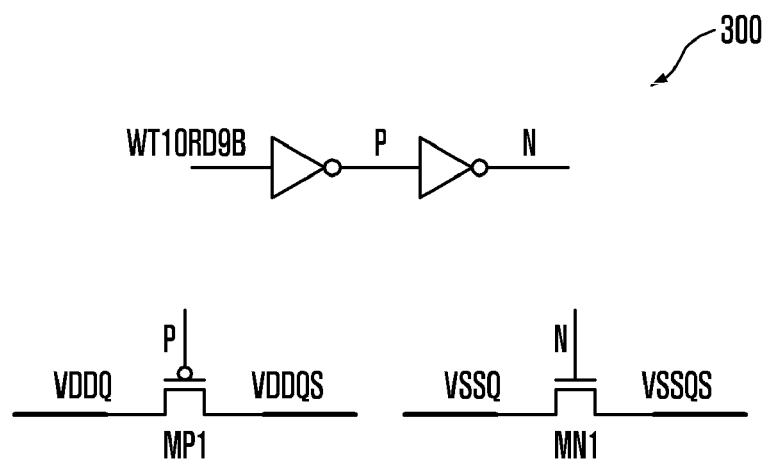
FIG. 4 is a circuit diagram of a power controller shown in FIG. 3.

FIG. 4 is a circuit diagram of the power controller shown in FIG. 3. Referring to FIG. 4, the power controller 300 includes a PMOS transistor MP1 and an NMOS transistor MN1. The PMOS transistor MP1 forms a current path between the power mesh 30A corresponding to the power supply voltage pad VDDQ for the data output driver and the power mesh 30C corresponding to the power supply voltage VDDQS for the data strobe signal output driver. The PMOS transistor MP1 receives a first control signal P, which is an inverted signal of the read period signal WT10RD9B, at a gate. The NMOS transistor MN1 forms a current path between the power mesh 35A corresponding to the ground voltage pad VSSQ for the data output driver and the power mesh 35C corresponding to the ground voltage pad VSSQS for the data strobe signal output driver. The NMOS transistor MN1 receives a second control signal N, which is an inverted signal of the first control signal P, at a gate. Here, the NMOS transistor MN1 may receive the read period signal WT10RD9B instead of the second control signal N.

For reference, the power controller 310 may have the same configuration as the power controller 300.

Figure 5:
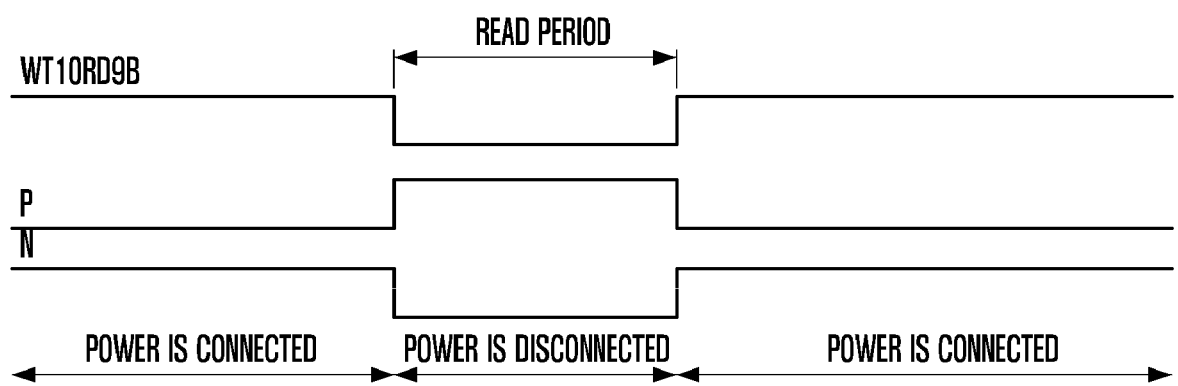
FIG. 5 is a timing diagram of the power controller of FIG. 4.

FIG. 5 is a timing diagram of the power controller of FIG. 4. Referring to FIG. 5, when the read period signal WT10RD9B is deactivated to a logic high level, the first control signal P has a logic low level and the second control signal N has a logic high level, so that the PMOS transistor MP1 and the NMOS transistor MN1 are both turned on. Accordingly, the power mesh 30A corresponding to the power supply voltage pad VDDQ for the data output driver and the power mesh 30C corresponding to the power supply voltage pad VDDQS for the data strobe signal output driver are connected to each other. Also, the power mesh 35A corresponding to the ground voltage pad VSSQ for the data output driver and the power mesh 35C corresponding to the ground voltage pad VSSQS for the data strobe signal output driver are connected to each other.

As the read command is applied, the read period signal WT10RD9B is activated to a logic low level during the read period. Then, the first control signal P has a logic high level and the second control signal N has a logic low level, so that the PMOS transistor MP1 and the NMOS transistor MN1 are both turned off. Accordingly, the power mesh 30A corresponding to the power supply voltage pad VDDQ for the data output driver and the power mesh 30C corresponding to the power supply voltage pad VDDQS for the data strobe signal output driver are separated from each other. Also, the power mesh 35A corresponding to the ground voltage pad VSSQ for the data output driver and the power mesh 35C corresponding to the ground voltage pad VSSQS for the data strobe signal output driver are separated from each other.

Thereafter, as the read operation is terminated, the read period signal WT10RD9B is deactivated to a logic high level. Then, the first control signal P has a logic low level and the second control signal N has a logic high level, so that the PMOS transistor MP1 and the NMOS transistor MN1 are both turned on. Accordingly, the power mesh 30A corresponding to the power supply voltage pad VDDQ for the data output driver and the power mesh 30C corresponding to the power supply voltage pad VDDQS for the data strobe signal output driver are connected to each other. Also, the power mesh 35A corresponding to the ground voltage pad VSSQ for the data output driver and the power mesh 35C corresponding to the ground voltage pad VSSQS for the data strobe signal output driver are connected to each other.

That is, during the read period, the power for the data output driver and the power for the data strobe signal output driver are separated from each other to fundamentally prevent the power noise generated at the data input/output pads DQ from affecting the data strobe signal pads DQS and DQSB. During the other period, the power mesh corresponding to the power for the data output driver and the power mesh corresponding to the power for the data strobe signal output driver are connected to each other to minimize resistance, thereby improving the chip power supply efficiency.

According to the above described embodiments, the synchronous semiconductor memory device can prevent the deterioration of the AC characteristics such as tDQSQ and tDQSCK and reduce the SSO noise in the read operation to thereby improve the high speed operation performance.

While the invention has been described with respect to the specific embodiments, they are to be considered merely illustrative, and it will be apparent to those skilled in the art that various changes and modifications may be made without departing from the spirit and scope of the invention as defined in the following claims.

For example, in the above described embodiments, the case where the data input/output pads DQ0 to DQ7 are disposed to either side of the data strobe signal pads DQS and DQSB is described, and thus the power meshes corresponding to the power pads for the data output driver are also described to be divided into two groups. However, when the data strobe signal pads DQS and DQSB are disposed to one side of the data input/output pads DQ0 to DQ7, the power meshes corresponding to the power pads VDDQ and VSSQ for the data output driver may not be divided into two groups. Surely, in this case, the skew between the data strobe signals DQS and DQSB and the data may become serious, but it does not mean that such a configuration is impossible.

In addition, in the above-described embodiments, both the power supply voltage and the ground voltage are described to be separated. However, even when only the power supply voltage is separated, a certain amount of effects can be obtained.

What is claimed is:

1. A semiconductor memory device, comprising:
   a plurality of first power supply voltage pads for a data output circuit;
   a first power mesh configured to connect the first power supply voltage pads to one another; and
   a second power supply voltage pad for a data strobe signal output circuit, wherein the second power supply pad is electrically separated from the first power mesh.

2. The semiconductor memory device as recited in claim 1, further comprising:
   a plurality of first ground voltage pads for the data output circuit;
   a second power mesh configured to connect the first ground voltage pads to one another; and
   a second ground voltage pad for the data strobe signal output circuit, wherein the second ground voltage pad is electrically separated from the second power mesh.

3. The semiconductor memory device as recited in claim 1, further comprising a plurality of data input/output pads, wherein the first power supply voltage pads are spaced apart from one another and disposed between the data input/output pads.

4. The semiconductor memory device as recited in claim 2, further comprising a plurality of data input/output pads, wherein the first ground voltage pads are spaced apart from one another and disposed between the data input/output pads.

5. The semiconductor memory device as recited in claim 1, further comprising a data strobe signal input/output pad, wherein the second power supply voltage pad is disposed adjacent to the data strobe signal input/output pad.

6. The semiconductor memory device as recited in claim 2, further comprising a data strobe signal input/output pad, wherein the second ground voltage pad is disposed adjacent to the data strobe signal input/output pad.

7. A semiconductor memory device, comprising:
   a plurality of data input/output pads;
   a plurality of first power supply voltage pads for a data output circuit;
   a first power mesh configured to connect the first power supply voltage pads to one another;
   a data strobe signal input/output pad for a data strobe signal output circuit;
   a second power supply voltage pad for the data strobe signal output circuit;
   a second power mesh connected to the second power supply voltage pad; and
   a first switch configured to selectively connect the first and second power meshes in response to a read period signal.

8. The semiconductor memory device as recited in claim 7, wherein the first power supply voltage pads are spaced from one another and disposed between the data input/output pads.

9. The semiconductor memory device as recited in claim 8, wherein the second power supply voltage pad is disposed adjacent to the data strobe signal input/output pad.

10. The semiconductor memory device as recited in claim 7, further comprising:
    a plurality of first ground voltage pads for the data output circuit;
    a third power mesh configured to connect the first ground voltage pads to one another;
    a second ground voltage pad for the data strobe signal output circuit;
    a fourth power mesh connected to the second ground voltage pad; and
    a second switch configured to selectively connect the third and fourth power meshes in response to the read period signal.

11. The semiconductor memory device as recited in claim 10, wherein the first ground voltage pads are spaced from one another and disposed between the data input/output pads.

12. The semiconductor memory device as recited in claim 11, wherein the second ground voltage pad is disposed adjacent to the data strobe signal input/output pad.

13. The semiconductor memory device as recited in claim 7, wherein the first switch includes a PMOS transistor configured to form a current path between the first power mesh and the second power mesh in response to an inverted signal of the read period signal.

14. The semiconductor memory device as recited in claim 10, wherein the second switch includes an NMOS transistor configured to form a current path between the third power mesh and the fourth power mesh in response to the read period signal at a gate of the transistor.

* * * * *